(12) United States Patent
Lane, Jr. et al.

(10) Patent No.: US 6,587,347 B1
(45) Date of Patent: Jul. 1, 2003

(54) CHASSIS SUPPORT MEMBER

(75) Inventors: James J. Lane, Jr., Sagamore, MA (US); Jeff Silverman, Stoughton, MA (US)

(73) Assignee: Telica, Inc., Marlboro, MA (US)

( * ) Notice: Subject to any disclaimer, the term of this patent is extended or adjusted under 35 U.S.C. 154(b) by 33 days.

(21) Appl. No.: 09/789,743

(22) Filed: Feb. 22, 2001

Related U.S. Application Data
(60) Provisional application No. 60/185,014, filed on Feb. 25, 2000.

(51) Int. Cl.$^7$ ................................................ G06F 1/16
(52) U.S. Cl. .................... 361/724; 361/725; 361/729
(58) Field of Search ........................ 361/679, 683–686, 361/724–749, 752, 753, 796, 807, 809

(56) References Cited

U.S. PATENT DOCUMENTS

| | | | | |
|---|---|---|---|---|
| 4,964,017 A | * | 10/1990 | Jindrick et al. | 361/390 |
| 5,406,455 A | * | 4/1995 | Devenish, III | 361/752 |
| 5,877,938 A | * | 3/1999 | Hobbs et al. | 361/724 |
| 6,223,909 B1 | * | 5/2001 | Mendoza | 211/26 |

* cited by examiner

Primary Examiner—Darren Schuberg
Assistant Examiner—Yean-Hsi Chang
(74) Attorney, Agent, or Firm—Hale and Dorr LLP

(57) ABSTRACT

At least one brackets is attached to each of opposing sides of a chassis holding telecommunications equipment, providing enhanced structural support thereto. The bracket preferably comprises a series of cutouts that allow access to a plurality of mounting holes used to secure the bracket to the equipment chassis. The cutouts advantageously allow cables to be extracted from the bracket and dressed to the front of the equipment for attachment to the chassis or individual plug-in modules as required. The bracket is preferably open at the top and bottom portions thereof to allow cables to pass therethrough.

6 Claims, 3 Drawing Sheets

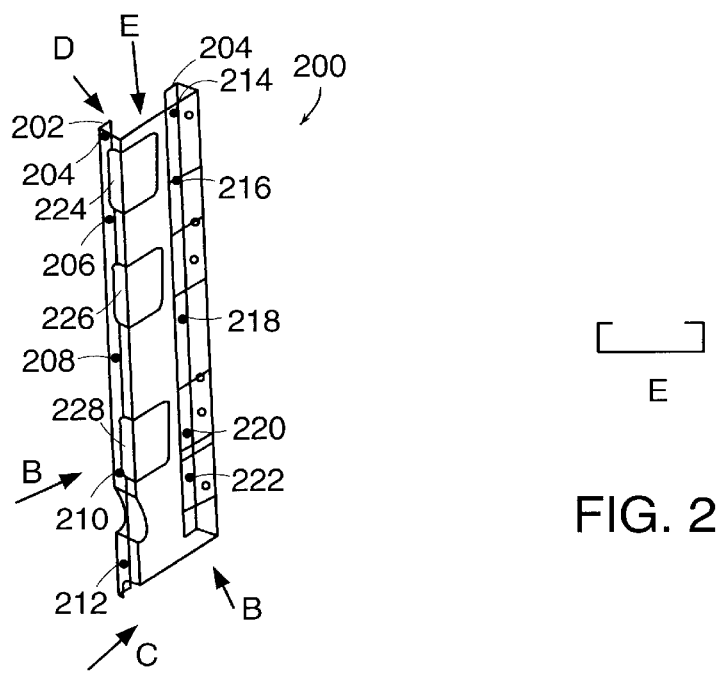
FIG. 2A
FIG. 2E
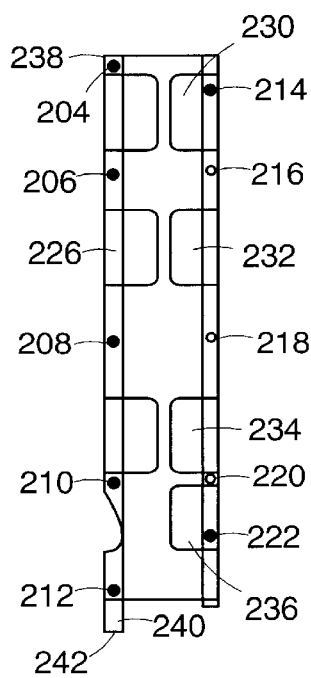
FIG. 2B
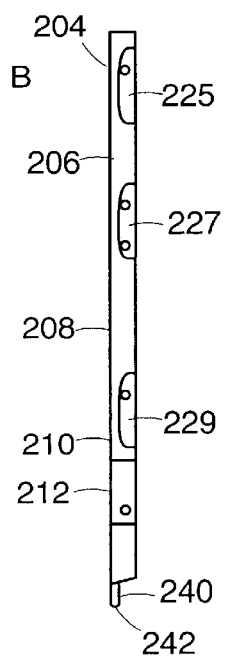
FIG. 2C
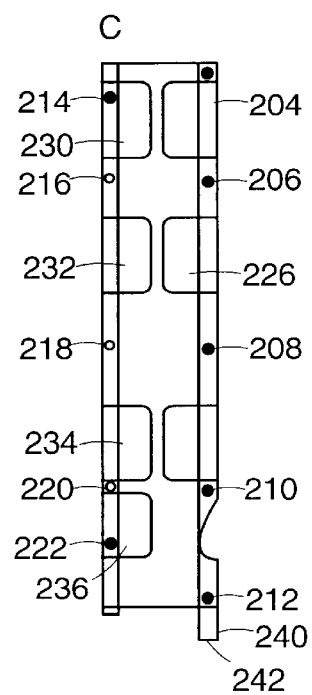
FIG. 2D

CHASSIS SUPPORT MEMBER

RELATED APPLICATION

This application claims priority from U.S. provisional application serial No. 60/185014 filed on Feb. 25, 2000 and entitled "Chassis Support and Cable Protection System", the details of which are hereby incorporated by reference.

BACKGROUND OF THE INVENTION

1. Field of the Invention

The present invention relates generally to a pair of rigid metallic members that may be attached to the sides of an electronic chassis and, more particularly, to a pair of rigid metallic members that can be used for organizing electrical or optical cables and enhancing the rigidity of the chassis.

2. Background Description

Computer and telecommunications equipment is commonly mounted in equipment racks. Such equipment is performing increasingly complex tasks and is generally assuming a corresponding increase in weight. As a result, equipment chassis are becoming larger, heavier, and generally designed to hold, for example, more plug-in modules. In the past, such equipment has been mounted using, for example, simple "L" shaped brackets attached to the sides of the equipment, or flanges bent into the front of the chassis sides. However, the larger and more complex equipment has rendered conventional mounting flanges and brackets less able to adequately support the equipment.

We have discovered, as shown in FIG. 1, that as this telecommunications equipment has generally become more highly functioned and correspondingly heavier, with more modules 102–138 in each chassis, substantial lateral forces 140 are exerted on the sides of the chassis 142, causing the sides 144 to bow outwards. This bowing tends to result in gaps (146–152) in the radio frequency (RF) gaskets located between modules particularly located nearest to the sides 144 of the chassis, as well as gaps between modules (102, 138) adjacent to the chassis wall 144. Gaps (not shown) may also occur between modules located toward the center of the plurality of modules 102–138 (e.g., modules 120 and 122, and/or modules 120 and 118, etc).

Electrical or optical cables (not shown) are typically connected to the fronts of the modules (102–138), whereas the rear of the modules (not shown) are generally plugged into separate equipment (not shown). In addition, more modules generally lead to more cables, which should preferably be arranged in a manner such that access to the modules and/or equipment is not obstructed. In addition, and particularly in the case of fiber optic cables, it is desirable to provide additional protection from, for example, random handling and impact forces that may be exerted on equipment wiring during normal equipment maintenance.

SUMMARY OF THE INVENTION

It is a feature and advantage of the present invention to provide an integrated mounting bracket and cable organizer ("the bracket") that can be attached to, for example, a telecommunications equipment chassis in order to provide additional structural support thereto.

It is still another feature and advantage of the present invention to provide a cabling channel that can replace existing channels often installed as a separate item in environments where computer or communications equipment is commonly installed, thereby providing a saving of material and installation expense for users of equipment employing the present invention.

It is yet another feature and advantage of the present, invention to provide a bracket that provides enhanced protection from the random handling and impact forces that may be exerted on equipment wiring during, for example, normal equipment maintenance.

It is another feature and advantage of the present invention to provide a bracket that facilitates access to the equipment.

The bracket according to the present invention is preferably a substantially rigid, substantially rectangular tube fabricated from substantially heavy gauge sheet metal. At least one brackets is preferably attached to each of opposing sides of, for example, a chassis holding telecommunications equipment. The bracket preferably comprises a series of cutouts that allow access to a plurality of mounting holes used to secure each bracket to the respective sides of the chassis. The cutouts advantageously allow cables to be extracted from the bracket and dressed to the front of the equipment for attachment to the chassis or individual plug-in modules as required. The bracket is preferably open at the top and bottom portions thereof to allow cables to pass therethrough.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the foregoing abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be made to the accompanying drawings and descriptive matter in which there is illustrated preferred embodiments of the invention.

BRIEF DESCRIPTION OF THE DRAWINGS

The Detailed Description including the description of a preferred structure as embodying features of the invention will be best understood when read in reference to the accompanying figures wherein:

FIG. 2A shows a perspective view of a preferred embodiment of the bracket according to the present invention;

FIG. 2B shows a front view of a preferred embodiment of the bracket;

FIG. 2C shows a side view of a preferred embodiment of the bracket;

FIG. 2D shows a back view of a preferred embodiment of the bracket;

FIG. 2E shows a top view of a preferred embodiment of the bracket; and

DETAILED DESCRIPTION OF A PREFERRED EMBODIMENT OF THE INVENTION

Figure 3:
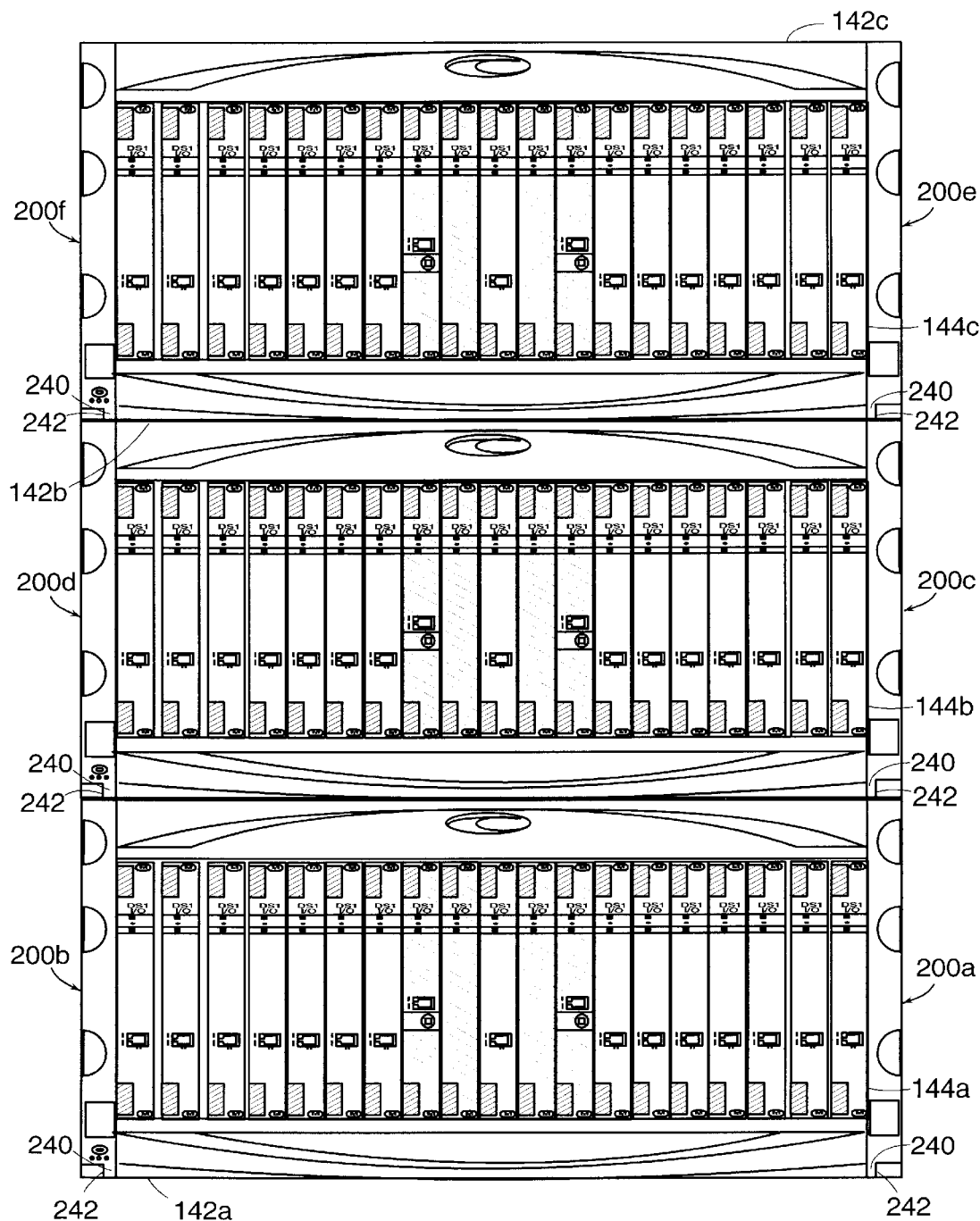
FIG. 3 shows a plurality of stacked chassis each having brackets according to the present invention fixedly secured thereto.

As shown in FIGS. 2A–2E, a preferred embodiment of the invention is a substantially rigid U-shaped bracket 200. When the bracket 200 is fixedly secured to, for example, an equipment chassis (as shown in FIG. 3), we have determined that the "U" shape of the bracket substantially increases its mechanical strength against, for example, bending forces as compared to, for example, simple angle brackets or flanges. The bracket 200 can be made of any suitable material that provides sufficient strength, although a metal or metal alloy is preferred. As shown in FIG. 2A, the bracket 200 contains flanges 202, 204 along each open side of the U to allow it to be secured to, for example, an equipment chassis (not shown). The bracket can be made of varying lengths. However, in a preferred embodiment, the bracket 200, extending from the top portion 238 to the bottom portion 242 of tip 240, as shown in FIGS. 2B–2D, substantially spans the entire length of the chassis to which it is to be secured. The flanges 202, 204 each contain several mounting points (204, 206, 208, 210, 212, 214, 216, 218, 220, 222) to attach to the sides of the chassis. A greater or fewer number of mounting points can be used depending on, for example, structural considerations and/or the length of the bracket 200. The mounting points can pass conventional mounting screws (not shown).

Figure 1:
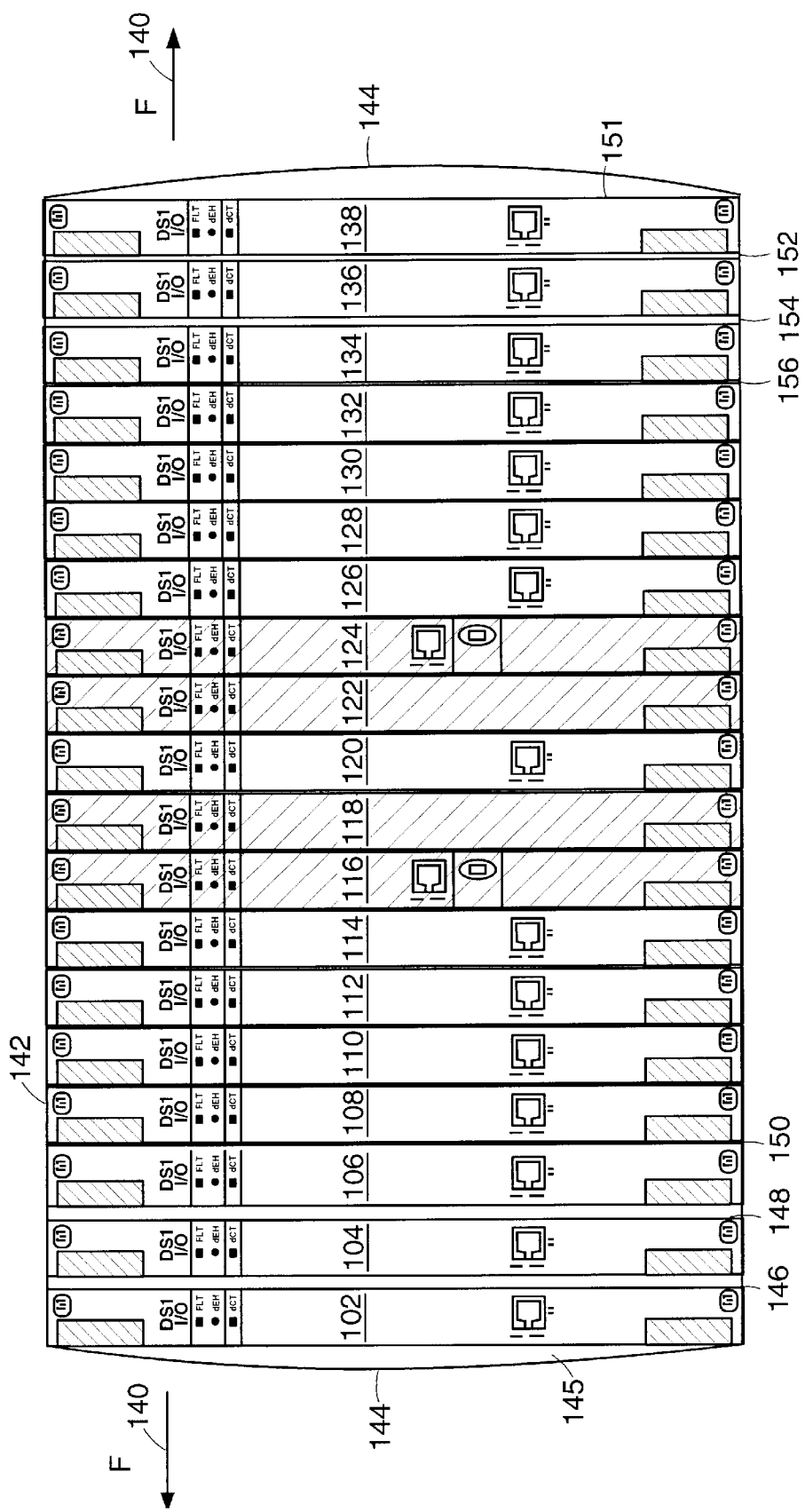
FIG. 1 is a prior art illustration showing how lateral forces can bow the sides of an equipment chassis.

Since the bracket 200 is preferably secured to the chassis along the two flanges 202, 204, the weight of the chassis is more widely and evenly distributed across the bracket 200, making the bracket 200 better able to sustain, as shown in FIG. 1, the lateral forces 140 exerted on the chassis than, for example, simple "L" shaped mounting flanges typically employed for this purpose.

FIGS. 2A–2D also show that bracket contains several cutouts (224, 226, 228, 230, 232, 234, 236) along its face and front surface. The cutouts 224, 226, 228, 230, 232, 234, 236) allow access for tools and/or fingers to install the mounting screws. Note that the cutouts (224, 226, 228, 230, 232, 234, 236) are preferably arranged so that the metal used to fabricate the bracket retains its continuity in a vertical line drawn from top to bottom over the center of the face, as shown in FIGS. 2B and 2D. This method of fabrication generally increases the strength of the bracket 200. Finally, FIG. 2E shows a top view of the bracket 200.

FIG. 3 shows first brackets 200a, 200c, 200e and second brackets 200b, 200d, 200f, each mounted to respective sides of a first chassis 142a, a second chassis 142b, and a third chassis 142c. As shown, the second chassis 142b is placed on top of the first chassis 142a, and the third chassis 142c is placed on top of the second chassis 142b. For each of the first 142a, second 142b, and third 142c chassis, a side access is provided near the tab 240 that advantageously allows cables to be touched and/or moved, etc.

Once installed on a chassis 142a, 142b, 142c, the respective brackets 200a, 200b and the respective walls of the chassis 144a, 144b, 144c form a substantially rigid structure-that counteracts the lateral forces 140 as shown in FIG. 1. The result is that the walls of the chassis 142a, 142b, 142c remain substantially true and parallel to the vertical edge of the plug-in modules, and the radio frequency interference integrity of the chassis is substantially maintained as the respective gaps 145, 151 between the chassis wall 144 and modules, and the gaps (146, 148, 150, 152, 154, 156) between modules, as shown in FIG. 1, are substantially eliminated.

The brackets (200a, 200c, 200e and 200b, 200d, 200f) attached to each of respective side of the chassis 142a, 142b, 142c form a robust vertical tube or duct suitable for routing cables. Since the bracket 200 is preferably fabricated from heavy sheet metal, it provides protection for, for example, fragile fiber optic cables. The cutouts (224, 226, 228, 230, 232, 234, 236) along the face of the bracket 200 now provide entry for fingers and/or tools, etc. to guide cables down the duct as they are inserted from the top or bottom. The bracket 200 may also contain cutouts (225, 227, 229) as shown, for example, in FIG. 2C, which provide exit points for various cables carried in the duct, allowing specific cables to be brought to the front of the equipment for connecting to individual modules. In this case, cutouts 225, 227 229 are preferably substantially contiguous with and therefore form a substantially contiguous opening with cutouts 224, 226 and 228. In a preferred embodiment, the principal cable exit point is cutout 226 as shown in FIGS. 2A, 2B and 2D.

As shown in FIG. 3, when brackets 200a–200f are respectively attached to several chassis 142a, 142b, 142c, which may all mounted, for example in the same equipment rack (not shown), the brackets 200a–200f have the additional feature of forming a top to bottom wiring channel as the bottom of one bracket (e.g., bracket 200c) meets the top of the bracket (e.g., bracket 200a) attached to the chassis 144a below. This channel can replace existing channels often installed as a separate item in environments where computer or communications equipment is commonly installed. This provides a saving of material and installation expense for users of equipment employing the invention. However, even if used in conjunction with equipment installed in the same rack and not using the bracket, the bracket can be used to guide and protect equipment cables terminating on this other equipment.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention. While the foregoing invention has been described in detail by way of illustration and example of preferred embodiments, numerous modifications, substitutions, and alterations are possible without departing from the scope of the invention defined in the following claims.

Having thus described our invention, what we claim as new and desire to secure by letters patent is as follows:

1. An integrated U-shape support member and cable protection article for routing and protecting fiber optical cables, comprising:
   a rigid flat member having a plurality of cutouts arranged so that a portion of said ridge flat member that extends centrally between a first longitudinal edge and a second longitudinal edge of said rigid flat member and from a top portion of said rigid flat member to a bottom portion of said rigid flat member is contiguous;
   a front wall extending from the first longitudinal edge of said rigid flat member and having a first attachment flange extending therefrom substantially parallel to said rigid flat member;
   a rear wall extending from the first longitudinal edge of said rigid flat member and having a first attachment flange extending therefrom substantially parallel to said rigid flat member;
   wherein said rigid flat member and said front and rear walls extending therefrom define a U-shaped transverse cross-section;
   wherein each of the plurality of cutouts enable at least one cable to be routed therethrough and provide access to at least one of the first and second attachment flanges
   wherein the first attachment flange is longer than said rigid flat member.

2. The article of claim 1 wherein the cutouts are substantially symmetric about the contiguous portion.

3. A system for holding a plurality of vertically mounted modules, comprising:
   a chassis for holding a plurality of modules substantially parallel to one another with their major surfaces oriented toward vertical first and second sides of the chassis; and
   an integrated U-shape support member at each of the first and second sides, for routing and protecting fiber optical cables, comprising:
   a rigid flat member having a plurality of cutouts arranged so that a portion of said rigid flat member that extends centrally between a first longitudinal edge and a second longitudinal edge of said rigid flat member and from a top portion of said rigid flat member to a bottom portion of said rigid flat member is contiguous;
   a front wall extending from the first longitudinal edge of said rigid flat member and having a first attachment flange extending therefrom substantially parallel to said rigid flat member and connected to the chassis; and
   a rear wall extending from the second longitudinal edge of said rigid flat member and having a second attachment flange extending therefrom substantially parallel to said rigid flat member and connected to the chassis;
   wherein said rigid flat member and said front and rear walls extending therefrom define a U-shaped transverse cross-section;
   wherein each of the plurality of cutouts enable at least one cable to be routed therethrough and provide access to at least a portion of at least one of the first and second attachment flanges;
   wherein the first and second attachment flanges are longer than said rigid flat member.

4. The system of claim 3 wherein the cutouts are substantially symmetric about the contiguous portion.

5. A system for holding a plurality of vertically mounted modules, comprising:
   a first chassis for holding a first plurality of modules substantially parallel to one another with their major surfaces oriented toward vertical first and second sides of the chassis;
   an integrated U-shape support member at each of the first and second sides of said first chassis, for routing and protecting fiber optical cables, comprising:
   a rigid flat member having a plurality of cutouts arranged so that a portion of said rigid flat member that extends centrally between a first longitudinal edge and a second longitudinal edge of said rigid flat member and from a top portion of said rigid flat member to a bottom portion of said rigid flat member is contiguous;
   a front wall extending from the first longitudinal edge of said rigid flat member and having a first attachment flange extending therefrom being longer than said rigid flat member and substantially parallel to said rigid flat member and connected to the first chassis; and
   a rear wall extending from the second longitudinal edge of said rigid flat member and having a second attachment flange extending therefrom being longer than said rigid flat member and substantially parallel to said rigid flat member and connected to said first chassis;
   wherein said rigid flat member and said front and rear walls extending therefrom define a U-shaped transverse cross-section;
   wherein the plurality of cutouts enable at least one cable to be routed therethrough and provide access to at least a portion of at least one of the first and second attachment flanges; and
   a second chassis for holding a second plurality of modules substantially parallel to one another with their major surfaces oriented toward vertical first and second sides of said second chassis, said second chassis being placed on top of said first chassis so the second plurality of modules of said second chassis are in substantial alignment with the first plurality of modules of said first chassis;
   an integrated U-shape support member at each of the first and second sides of said second chassis, for routing and protecting fiber optical cables, comprising:
   a rigid flat member having a plurality of cutouts arranged so that a portion of said rigid flat member that extends centrally between a first longitudinal edge and a second longitudinal edge of said rigid flat member and from a top portion of said rigid flat member to a bottom portion of said rigid flat member is contiguous;

a front wall extending from the first longitudinal edge of said rigid flat member and having a first attachment flange extending therefrom being longer than said rigid flat member and substantially parallel to said rigid flat member and connected to said second chassis, wherein the first attachment flange is in substantial contact with the first attachment flange connected to said first chassis; and a rear wall extending from the second longitudinal edge of said rigid flat member and having a second attachment flange extending therefrom being longer than said rigid flat member and substantially parallel to said rigid flat member and connected to the chassis;

wherein said rigid flat member and said front and rear walls extending therefrom define a U-shaped transverse cross-section;

wherein the plurality of cutouts enable at least one cable to be routed therethrough and provide access to at least a portion of at least one of the first and second attachment flanges.

6. The system according to claim 5 wherein the cutouts of the rigid flat members associated with each of the first and second chassis are substantially symmetric about the contiguous portion.

* * * * *